(12) United States Patent
Kim et al.

(10) Patent No.: US 9,818,825 B2
(45) Date of Patent: Nov. 14, 2017

(54) SEMICONDUCTOR DEVICE AND METHOD OF FABRICATING THE SAME

(71) Applicant: SAMSUNG ELECTRONICS CO., LTD., Suwon-si, Gyeonggi-do (KR)

(72) Inventors: Dong-Kwon Kim, Gimcheon-si (KR); Yong-Woo Lee, Anyang-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/145,252

(22) Filed: May 3, 2016

(65) Prior Publication Data

US 2017/0117363 A1 Apr. 27, 2017

Related U.S. Application Data

(60) Provisional application No. 62/246,883, filed on Oct. 27, 2015.

(51) Int. Cl.

| | |
|---|---|
| *H01L 29/10* | (2006.01) |
| *H01L 21/8238* | (2006.01) |
| *H01L 27/092* | (2006.01) |
| *H01L 29/161* | (2006.01) |
| *H01L 29/165* | (2006.01) |
| *H01L 29/16* | (2006.01) |
| *H01L 27/11* | (2006.01) |

(52) U.S. Cl.
CPC .. *H01L 29/1054* (2013.01); *H01L 21/823807* (2013.01); *H01L 21/823821* (2013.01); *H01L 27/0924* (2013.01); *H01L 27/1104* (2013.01); *H01L 27/1116* (2013.01); *H01L 29/161* (2013.01); *H01L 29/165* (2013.01); *H01L 29/1608* (2013.01)

(58) Field of Classification Search
CPC ......... H01L 29/1054; H01L 21/823821; H01L 21/823807; H01L 27/0924; H01L 27/1116; H01L 29/165; H01L 29/1608; H01L 27/1104; H01L 29/161
See application file for complete search history.

(56) References Cited

U.S. PATENT DOCUMENTS

| | | |
|---|---|---|
| 7,141,856 B2 | 11/2006 | Lee et al. |
| 7,534,686 B2 | 5/2009 | Lee et al. |
| 7,692,246 B2 | 4/2010 | Dreeskornfeld et al. |

(Continued)

FOREIGN PATENT DOCUMENTS

KR  1020050017584  2/2005

*Primary Examiner* — Latanya N Crawford
(74) *Attorney, Agent, or Firm* — F. Chau & Associates, LLC

(57) ABSTRACT

A method of fabricating a semiconductor device is provided as follows. A channel layer is formed on a strain relaxed buffer (SRB) layer. A first etching process is performed on the channel layer and the SRB layer to form a plurality of trenches. The trenches penetrate through the channel layer and into the SRB layer to a first depth. First liners are formed on first sidewalls of the trenches having the first depth. The first liners cover the first sidewalls. A second etching process is performed on the SRB layer exposed through the trenches. The second etching process is performed on the SRB layer using a gas etchant having etch selectivity with respect to the first liners so that after the performing of the second etching process, the first liners remain on the first sidewalls.

20 Claims, 25 Drawing Sheets

(56) References Cited

U.S. PATENT DOCUMENTS

| | | | |
|---|---|---|---|
| 8,497,171 B1 | 7/2013 | Wu et al. | |
| 8,513,131 B2 | 8/2013 | Cai et al. | |
| 8,815,661 B1 | 8/2014 | Basker et al. | |
| 8,883,575 B2 | 11/2014 | Fischer et al. | |
| 9,035,431 B2 | 5/2015 | Cheng et al. | |
| 9,048,120 B2 | 6/2015 | Suk et al. | |
| 9,093,533 B2 | 7/2015 | Cheng et al. | |
| 9,117,875 B2 | 8/2015 | Jacob et al. | |
| 9,142,641 B1 | 9/2015 | Lin et al. | |
| 2014/0353767 A1 | 12/2014 | Liu et al. | |
| 2015/0268189 A1 | 9/2015 | Rigante et al. | |
| 2015/0279971 A1 | 10/2015 | Xie et al. | |
| 2016/0056277 A1* | 2/2016 | Lee | H01L 29/785 257/401 |
| 2016/0343623 A1* | 11/2016 | Fogel | H01L 21/82387 |

* cited by examiner

1000

SEMICONDUCTOR DEVICE AND METHOD OF FABRICATING THE SAME

CROSS-REFERENCE TO RELATED APPLICATION

This application claims the benefit under 35 U.S.C. §119(e) to U.S. Provisional Patent Application No. 62/246,883, filed on Oct. 27, 2015 in the United States Patent & Trademark Office, the disclosure of which is incorporated by reference herein in its entirety.

TECHNICAL FIELD

The present inventive concept relates to a method of fabricating a semiconductor device.

DISCUSSION OF RELATED ART

Semiconductor devices include an N-type field effect transistor (NFET) and a P-type field effect transistor (PFET). With various connections among NFETs and PFETs, a logic switch, an inverter, or a memory cell of a static random access memory (SRAM) device are formed in the semiconductor devices. As the NFETs and PFETs of the semiconductor devices become smaller, the semiconductor devices may include three dimensional transistors such as a fin type field effect transistor (FinFET).

SUMMARY

According to an exemplary embodiment of the present inventive concept, a method of fabricating a semiconductor device is provided as follows. A heterogeneous channel layer is formed on a strain relaxed buffer (SRB) layer. The heterogeneous channel layer includes a silicon layer on a first portion of the SRB layer and a silicon germanium (SiGe) alloy layer on a second portion of the SRB layer. A first etching process is performed on the heterogeneous channel layer and the SRB layer to form a plurality of first trenches and a plurality of second trenches. Each first trench penetrates through the silicon layer and into the first portion of the SRB layer to a first depth. Each second trench penetrates through the SiGe alloy layer and into the second portion of the SRB layer to a second depth. First liners are formed on first sidewalls of the first trenches having the first depth and second sidewalls of the second trenches having the second depth. A second etching process is performed on the SRB layer exposed by the first liners so that the first trenches are extended to a third depth to form a plurality of first fin type structures and the second trenches are extended to a fourth depth to form a plurality of second fin type structures. The first fin type structures are defined by the first trenches having the third depth and the second fin type structures are defined by the second trenches having the fourth depth.

According to an exemplary embodiment of the present inventive concept, a method of fabricating a semiconductor device is provided as follows. A channel layer is formed on a strain relaxed buffer (SRB) layer. A first etching process is performed on the channel layer and the SRB layer to form a plurality of trenches. The trenches penetrate through the channel layer and into the SRB layer to a first depth. First liners are formed on first sidewalls of the trenches having the first depth. The first liners cover the first sidewalls. A second etching process is performed on the SRB layer exposed through the trenches. The second etching process is performed on the SRB layer using a gas etchant having etch selectivity with respect to the first liners so that after the performing of the second etching process, the first liners remain on the first sidewalls.

According to an exemplary embodiment, a semiconductor device includes a first transistor, a second transistor and a gate line. The first transistor and the second transistor are disposed on a strain relaxed buffer (SRB) layer. The SRB layer includes a first protrusion and a second protrusion. The first protrusion and the second protrusion are protruded from an upper surface of the SRB layer. The gate line is connected to a first gate electrode of the first transistor and a second gate electrode of the second transistor. The first transistor includes a silicon layer stacked on an upper surface of the first protrusion. The second transistor includes a silicon germanium alloy layer stacked on the second protrusion. A width of the first protrusion is greater than a width of the second silicon layer, the width of the first protrusion and the width of the second silicon layer being measured at a boundary between the first protrusion and the silicon layer. A width of the second protrusion is greater than a width of the silicon germanium alloy layer, the width of the second protrusion and the width of the silicon germanium alloy layer being measured at a boundary between the second protrusion and the silicon germanium alloy layer.

BRIEF DESCRIPTION OF DRAWINGS

These and other features of the present inventive concept will become more apparent by describing in detail exemplary embodiments thereof with reference to the accompanying drawings of which.

Figure 1:
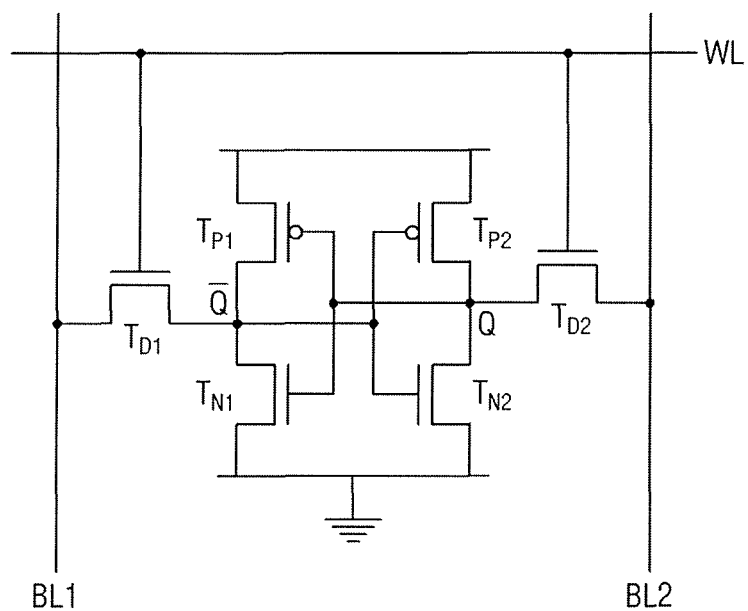
FIG. 1 is a circuit diagram of a unit memory cell of a static random access memory (SRAM) device according to an exemplary embodiment of the present inventive concept.

It will be appreciated that for simplicity and clarity of illustration, elements illustrated in the drawings have not necessarily been drawn to scale. For example, the dimensions of some of the elements are exaggerated relative to other elements for clarity. Further, where considered appropriate, reference numerals have been repeated among the drawings to indicate corresponding or analogous elements.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

DETAILED DESCRIPTION OF EXEMPLARY EMBODIMENTS

Exemplary embodiments of the present inventive concept will be described below in detail with reference to the accompanying drawings. However, the inventive concept may be embodied in different forms and should not be construed as limited to the embodiments set forth herein. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present.

Figure 2:
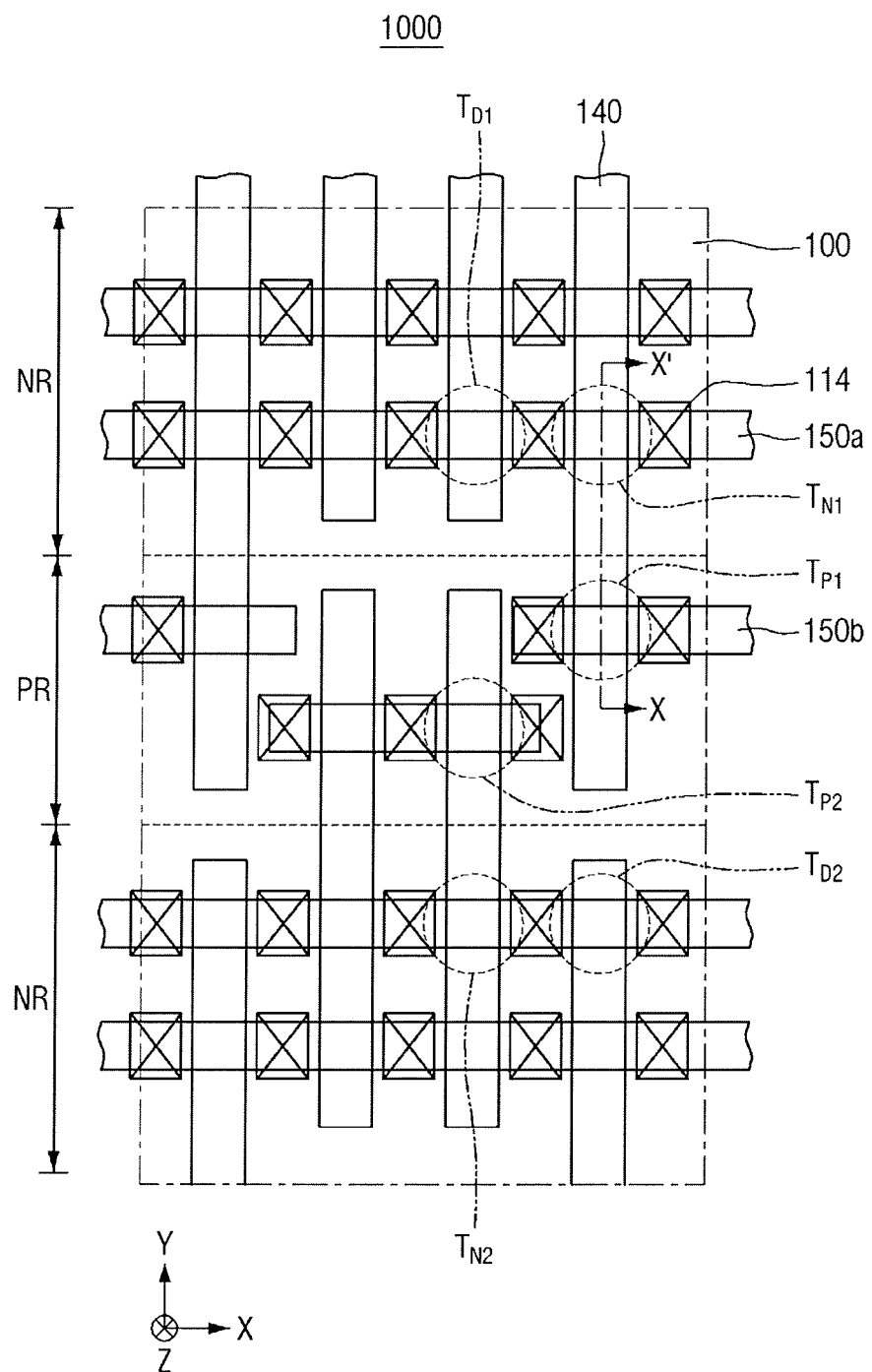
FIG. 2 is a layout of the memory cell of FIG. 1 according to an exemplary embodiment of the present inventive concept.
Figure 3:
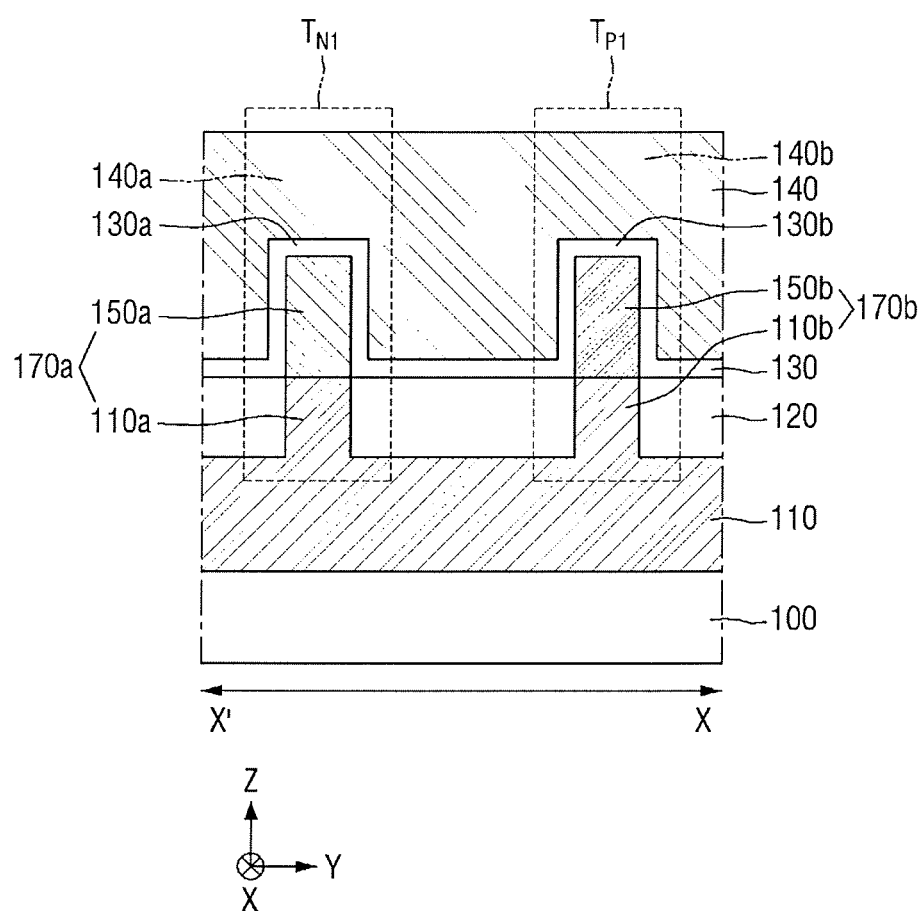
FIG. 3 is a cross-sectional view of FIG. 2 taken along line X-X' according to an exemplary embodiment of the present inventive concept.
Figure 4:
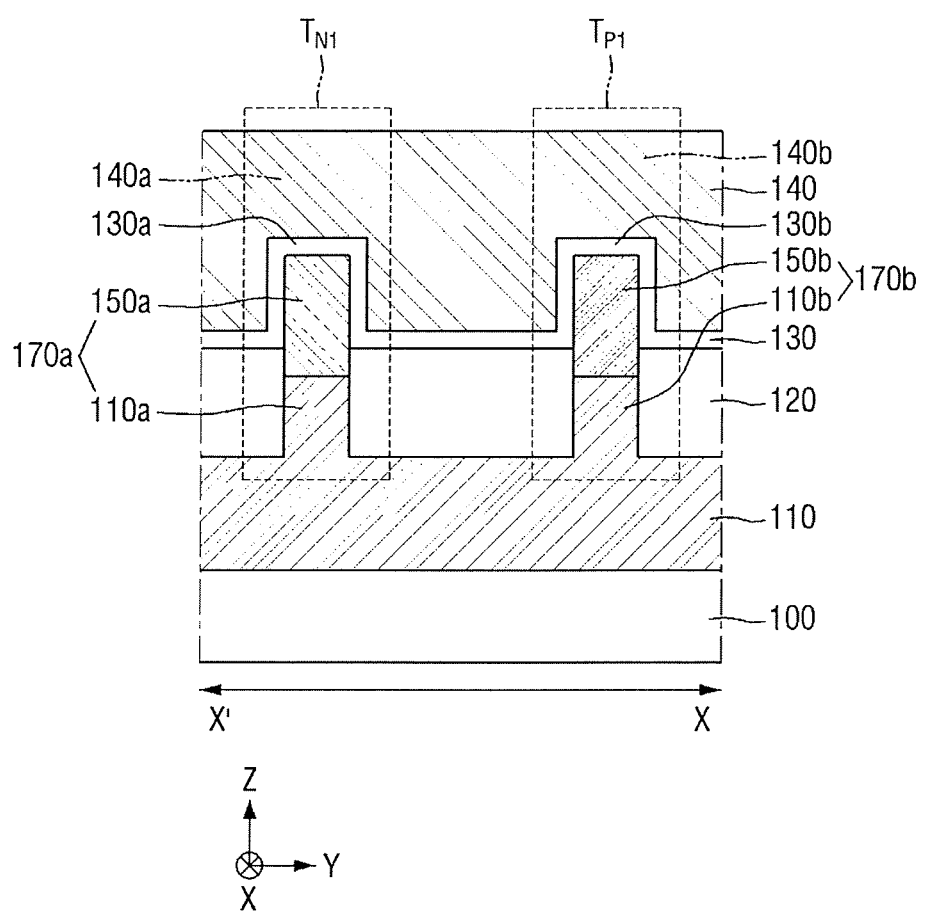
FIG. 4 is a cross-sectional view of FIG. 2 taken along line X-X' according to an exemplary embodiment of the present inventive concept.

FIG. 1 is a circuit diagram of a unit memory cell of a static random access memory (SRAM) device according to an exemplary embodiment of the present inventive concept. FIG. 2 is a layout of the memory cell of FIG. 1 according to an exemplary embodiment of the present inventive concept. FIG. 3 is a cross-sectional view of FIG. 2 taken along line X-X' according to an exemplary embodiment of the present inventive concept. FIG. 4 is a cross-sectional view of FIG. 2 taken along line X-X' according to an exemplary embodiment of the present inventive concept.

In FIG. 1, a unit memory cell 1000 of an SRAM device is formed of six transistors $T_{P1}$, $T_{P2}$, $T_{N1}$, $T_{N2}$, $T_{D1}$ and $T_{D2}$. The unit memory cell 1000 may store a data or provide a data stored according to a write or read operation. The unit memory cell 1000 may include NFETs $T_{D1}$, $T_{N1}$, $T_{D2}$, and $T_{N2}$, PFETs $T_{P1}$ and $T_{P2}$, bit lines BL1 and BL2, and a word line WL. "NFETs" is a plural form of "NFET", and "PFETs" is a plural form of "PFET". The bit lines BL1 and BL2 include a first bit line BL1 and a second bit line BL2. The word line WL is connected to gate electrodes of driving transistors $T_{D1}$ and $T_{D2}$ of the NFETs. The first bit line BL1 is connected to a terminal of a first driving transistor $T_{D1}$. The second bit line BL2 is connected to a terminal of a second driving transistor $T_{D2}$. A first pair of NFET $T_{N1}$ and PFET $T_{P1}$ and a second pair of NFET $T_{N2}$ and PFET $T_{P2}$ are cross-coupled inverters to form a latch. The latch may hold or store data. The driving transistors $T_{D1}$ and $T_{D2}$ are access transistors to allow a current path to be formed between the bit lines BL1 and BL2 and the cross-coupled inverters formed of the transistors $T_{N1}$ and $T_{P1}$ and $T_{N2}$ and $T_{P2}$. The word line WL is a control signal line to switch the driving transistors $T_{D1}$ and $T_{D2}$.

In FIG. 2, the unit memory cell 1000 includes a substrate 100 having N-regions NR and a P-region PR. The NFETs $T_{D1}$, $T_{N1}$, $T_{D2}$, and $T_{N2}$ are formed in the N-regions NR, and the PFETs $T_{P1}$ and $T_{P2}$ are formed in the P-region PR. The NFETs $T_{D1}$, $T_{N1}$, $T_{D2}$, and $T_{N2}$ and the PFETs $T_{P1}$ and $T_{P2}$ include active fins 150a and 150b which extend in parallel to a first direction of an x-axis. A gate electrode 140 crosses the active fins 150a and 150b. The gate electrode 140 extends in parallel to a second direction of a y-axis which crosses the first direction. Sources/drains 114 may be formed in the substrate. The source/drains 114 may be adjacent to both sides of the gate electrode 140. In an exemplary embodiment, the source/drains 114 may be epitaxially formed, which may be referred to as an elevated source/drain. Source/drain contacts (not shown here) may be in contact with the source/drains 114 of the NFET $T_{N1}$ and PFET $T_{P1}$. The source/drain contacts may extend in parallel to a third direction of a z-axis. Hereinafter, the NFET $T_{N1}$ and the PFET $T_{P1}$ may be referred to as a first transistor $T_{N1}$ and a second transistor $T_{P1}$, respectively.

In FIG. 3, the first transistor $T_{N1}$ and the second transistor $T_{P1}$ of FIG. 1 are disposed on a strain relaxed buffer (SRB) layer 110. The first transistor $T_{N1}$ includes a first active fin 150a, a first gate oxide layer 130a, and a first gate electrode 140a to form an NFET. The second transistor $T_{P1}$ includes a second active fin 150b, a second gate oxide layer 130b and a second gate electrode 140b to form a PFET. The transistors $T_{N1}$ and $T_{P1}$ are connected to each other through a gate electrode 140 to form a complementary metal-oxide-semiconductor (CMOS) inverter. The gate electrode 140 includes the first gate electrode 140a and the second gate electrode 140b. The gate electrode 140 may correspond to the word line of FIG. 1.

The SRB layer 110 may be epitaxially formed on a substrate 100. The SRB layer 110 includes a first protrusion 110a and a second protrusion 110b protruded in parallel to the third direction (z-axis) from an upper surface of the SRB layer 110. The SRB layer 110 may be formed of a first silicon germanium alloy ($Si_xGe_y$) epitaxially grown from the substrate 110. The SRB layer 110 may also be referred to as a first SiGe layer. For example, the sum of "x" and "y" is equal to 1, and "x" is about 0.75 and "y" is about 0.25. The present inventive concept is not limited thereto. The method of forming the first protrusion 110a and the second protrusion 110b will be described later.

The first active fin 150a and the second active fin 150b are disposed on the SRB layer 110. For example, the first active fin 150a is disposed on an upper surface of the first protrusion 110a of the SRB layer 110. The second active fin 150b is disposed on an upper surface of the second protrusion 110b of the SRB layer 110. The combined structure of the first active fin 150a and the first protrusion 110a may be referred to as a first fin type structure 170a. The combined structure of the second active fin 150b and the second protrusion 110b may be referred to as a second fin type structure 170b.

The first active fin 150a may be formed of silicon (Si) and may be epitaxially grown from the SRB layer 110. The present inventive concept is not limited thereto. For example, the first active fin 150a may be formed of silicon carbide alloy (SiC).

The lattice parameter of the SRB layer 110 may be greater than the lattice parameter of the first active fin 150a. The lattice mismatch between the SRB layer 110 and the first active fin 150a may cause to apply a tensile stress to the first active fin 150a.

If the first transistor $T_{N1}$ is turned on, a channel region is formed in the first active fin 150a so that current flows through the channel region in parallel to the first direction (x-axis) which is perpendicular to the cross-section shown in FIG. 3. The tensile stress applied to the first active fin 150a may increase mobility of carriers (for example, electrons) of the first transistor $T_{N1}$.

The second active fin 150b may be formed of second silicon germanium alloy ($Si_kGe_m$) epitaxially grown from the SRB layer 110. The second silicon germanium alloy ($Si_kGe_m$) of the second active fin 150b is different from the first silicon germanium alloy ($Si_xGe_y$) of the SRB layer 110. For example, k+m is equal to 1, and k is about 0.5 and m is about 0.5. In this case, the lattice parameter of the second silicon germanium alloy ($Si_kGe_m$) is greater than the lattice parameter of the first silicon germanium alloy ($Si_xGe_y$). The lattice mismatch between the second active fin 150b and the SRB layer 110 may cause to apply a compressive stress to the second active fin 150b.

If the second transistor $T_{P1}$ is turned on, a channel region is formed in the second transistor $T_{P1}$ so that current flows through the channel region in parallel to the first direction (x-axis) which is perpendicular to the cross section shown in FIG. 3. The compressive stress applied to the second active fin 150b may increase mobility of carriers (for example, holes) of the second transistor $T_{P1}$.

An isolation 120 is disposed between the first fin type structure 170a and the second fin type structure 170b. The isolation 120 fills a space between the first fin type structure 170a and the second fin type structure 170b. The isolation 120 may be formed of silicon oxide, for example. An upper surface of the isolation 120 is substantially coplanar with the upper surfaces of the first and the second protrusions 110a and 110b of the SRB layer 110. For example, the upper surface of the isolation 120 is substantially coplanar with a boundary between the first protrusion 110a and the first active fin 150a and a boundary between the second protrusion 110b and the second active fin 150b.

The present inventive concept is not limited thereto. For example, the upper surface of the isolation 120 may be higher than the upper surfaces of the first and the second protrusions 110a and 110b, as shown in FIG. 4. In FIG. 4, the transistors $T_{N1}$ and $T_{P1}$ of FIG. 4 are substantially the same as those of FIG. 3, except that the isolation 120 of FIG. 4 has an upper surface higher than the upper surfaces of the first protrusion 110a and the second protrusion 110b.

Referring back to FIG. 3, a first gate oxide layer 130a is interposed between the first active fin 150a and a first gate electrode 140a. The stacked structure of the first active fin 150a, the first gate oxide layer 130a and the first gate electrode 140a may constitute the first transistor $T_{N1}$ with source/drains (not shown here). If the first transistor $T_{N1}$ is turned on, an N-type channel may be formed in the first active fin 150a along a boundary between the first gate oxide layer 130a and the first active fin 150a and current flows through the N-type channel. In the N-type channel, electrons (majority carriers of the current flow) may have increased mobility due to the tensile stress as discussed above. The boundary between the first gate oxide layer 130a and the first active fin 150a may correspond to a width of the N-type channel formed in the first active fin 150a. Since the sidewall region of the first active fin 150a is provided as part of the N-type channel, the current driving capability of the first transistor $T_{N1}$ may increase without increasing the planar size of the first transistor $T_{N1}$ and thus more transistors may be fabricated per a unit area, compared with a planar transistor.

A second gate oxide layer 130b is interposed between the second active fin 150b and a second gate electrode 140b. The stacked structure of the second active fin 150b, the second gate oxide layer 130b and the second gate electrode 140b may constitute the second transistor $T_{P1}$ with source/drains (not shown here). If the first transistor $T_{P1}$ is turned on, a P-type channel may be formed in the second active fin 150b along a boundary between the second gate oxide layer 130b and the second active fin 150b. In the P-type channel, holes, majority carriers of the current flow, may have increased mobility due to the compressive stress discussed above.

The boundary between the second gate oxide layer 130b and the second active fin 150b may correspond to a width of the P-type channel formed in the second active fin 150b. Since the sidewall region of the second active fin 150b is provided as part of the P-type channel, the current driving capability of the second transistor $T_{P1}$ may increase without increasing the planar size of the second transistor $T_{P1}$ and thus more transistors may be fabricated per a unit area, compared with a planar transistor.

The first gate oxide layer 130a and the second gate oxide layer 130b are part of an oxide layer 130. An overlapped part of the oxide layer 130 with the first active fin 150a corresponds to the first gate oxide layer 130a. Similarly, an overlapped part of the oxide layer 130 with the second active fin 150b corresponds to the second gate oxide layer 130b.

The first gate electrode 140a and the second gate electrode 140b are part of the gate electrode 140 which is electrically conductive. The gate electrode 140 may be formed of doped silicon, metal or a stacked structure thereof. Referring back to FIGS. 1 and 2, the gate electrode 140 is commonly connected to the first transistor $T_{P1}$ and the second transistor $T_{N1}$, providing the first gate electrode 140a to the first transistor TR1 and the second gate electrode 140b to the second transistor TR2.

According to an exemplary embodiment, the oxide layer 130 is in contact with only an uppermost layer of a fin type structure so that different materials of the fin type structure do not serve as a channel region. For example, as shown in FIGS. 3 and 4, the first active fin 150a alone is in contact with the first gate oxide layer 130a so that the N-type channel is formed in the first active fin 150a only; the second active fin 150b alone is in contact with the second gate oxide layer 130b so that the P-type channel is formed in the second active fin 150b only.

According to an exemplary embodiment, a boundary between the first active fin 150a and the first protrusion 110a of the SRB layer 110 is substantially coplanar with a boundary between the second active fin 150b and the second protrusion 110b of the SRB layer 110.

According to an exemplary embodiment, an SRAM may include an NFET having the first fin type structure 170a and a PFET having the second fin type structure 170b. The first fin type structure 170a and the second fin type structure 170b are formed of different materials from each other. For example, the first fin type structure 170a includes the first active fin 150a formed of silicon, and the second fin type structure 170b includes the second active fin 150b formed of the second silicon germanium alloy ($Si_mGe_k$).

As described above, the fin type structure 170a and 170b may be formed of different materials for controlling stress-induced mobility enhancements of NFETs and PFETs. In an exemplary embodiment, the fin type structures 170a and 170b having different materials are simultaneously patterned in the same etching process. The simultaneous formation of the fin type structures 170a and 170b may reduce the number of process steps for forming the fin type structures 170a and 170b. However, if the fin type structures 170a and 170b have different etching profile in the same etching process, the widths of the transistors $T_{N1}$ and $T_{P1}$ of the SRAM 500 may be difficult to control in the same etching process.

Figure 5:
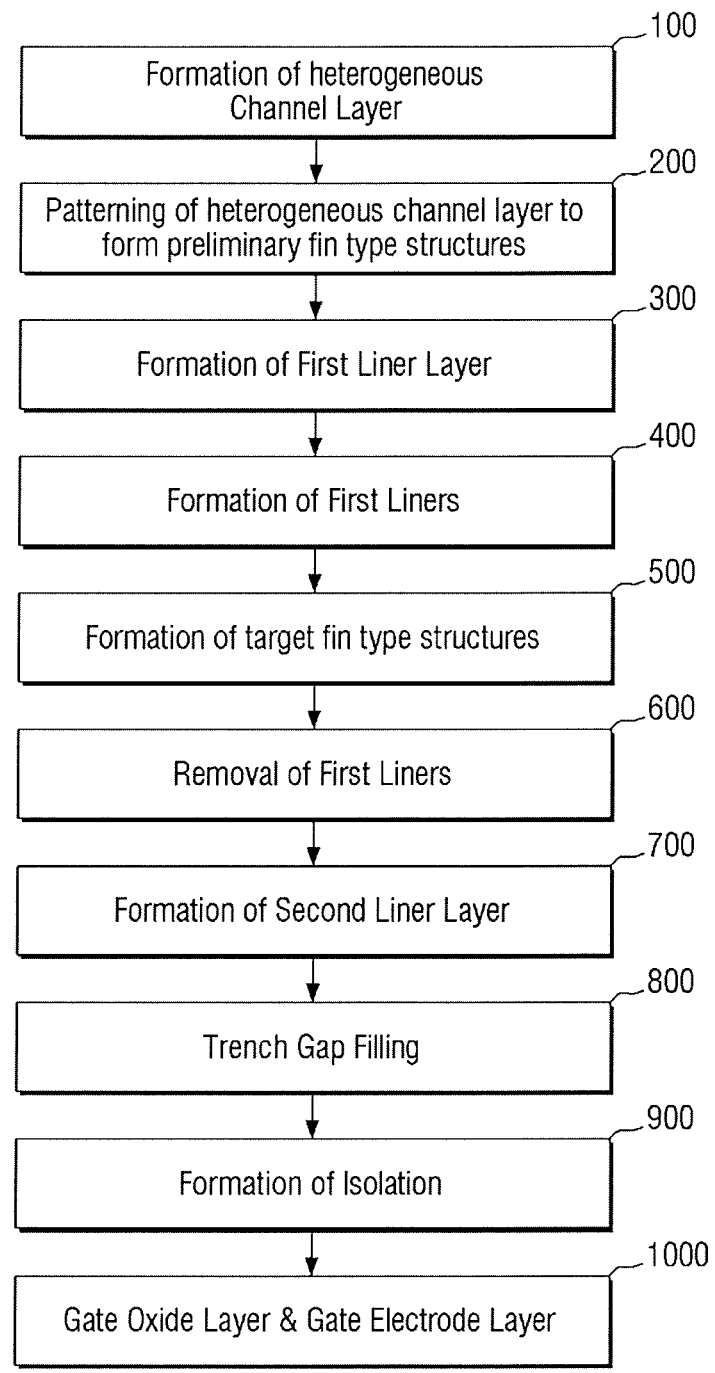
FIG. 5 shows a flowchart of simultaneously fabricating fin type structures of FIG. 3 according to an exemplary embodiment of the present inventive concept.

Hereinafter, a fabrication process of the fin type structures 170a and 170b of FIG. 3 will be described with reference to FIGS. 5-15. FIG. 5 shows a flowchart of simultaneously fabricating the fin type structures 170a and 170b of FIG. 3 according to an exemplary embodiment of the present inventive concept. FIGS. 6-15 show vertical cross-sectional views of the fin type structures 170a and 170b simultaneously fabricated according to the flowchart of FIG. 5.

Figure 6:
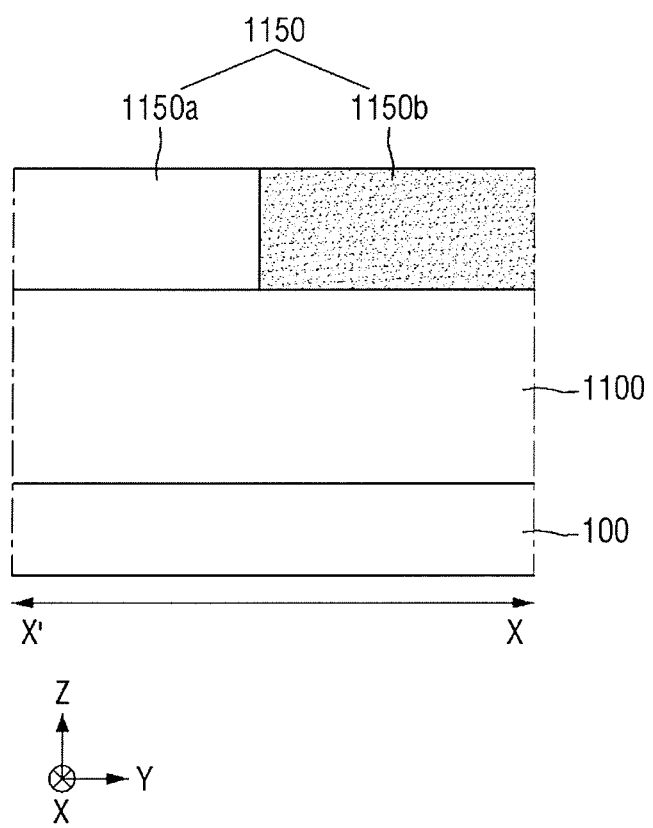
FIGS. 6-15 show vertical cross-sectional views of fin type structures simultaneously fabricated according to the flowchart of FIG. 5.

FIG. 6 shows a heterogeneous channel layer 1150 formed after completing step 100 of FIG. 5. In step 100, a preliminary strain relaxed buffer (preliminary SRB) layer 1100 is formed on a substrate 100. The preliminary SRB layer 1100 may be epitaxially formed using the substrate 100 as a seed layer. The preliminary SRB layer 1100 may be formed of a first silicon germanium alloy including germanium at a first atomic percent. In an exemplary embodiment, the first atomic percent of germanium in the first silicon germanium alloy may be about 25%.

The heterogeneous channel layer 1150 is formed on the preliminary SRB layer 1100. The formation of the heterogeneous channel layer 1150 is described in U.S. patent application Ser. No. 15/145,040 filed on May 3, 2016, which are incorporated by reference.

The heterogeneous channel layer 1150 includes a silicon layer 1150a and a silicon germanium alloy layer 1150b. The silicon germanium alloy layer 1150b may be formed of a second silicon germanium alloy having germanium at a second atomic percent. In an exemplary embodiment, the second atomic percent of germanium is greater than the first atomic percent of germanium. For example, the second atomic percent of germanium in the second silicon germanium alloy may be about 50%.

The silicon layer 1150a and the silicon germanium alloy layer 1150b are in contact with each other. An upper surface of the silicon layer 1150a is substantially coplanar with an upper surface of the silicon germanium alloy layer 1150b. A lower surface of the silicon layer 1150a is substantially coplanar with a lower surface of the silicon germanium alloy layer 1150b.

The preliminary SRB layer 1100 may be epitaxially formed using a substrate 100 as a seed layer. In an exemplary embodiment, the substrate 100 may be formed of silicon or a silicon germanium alloy.

Figure 7:
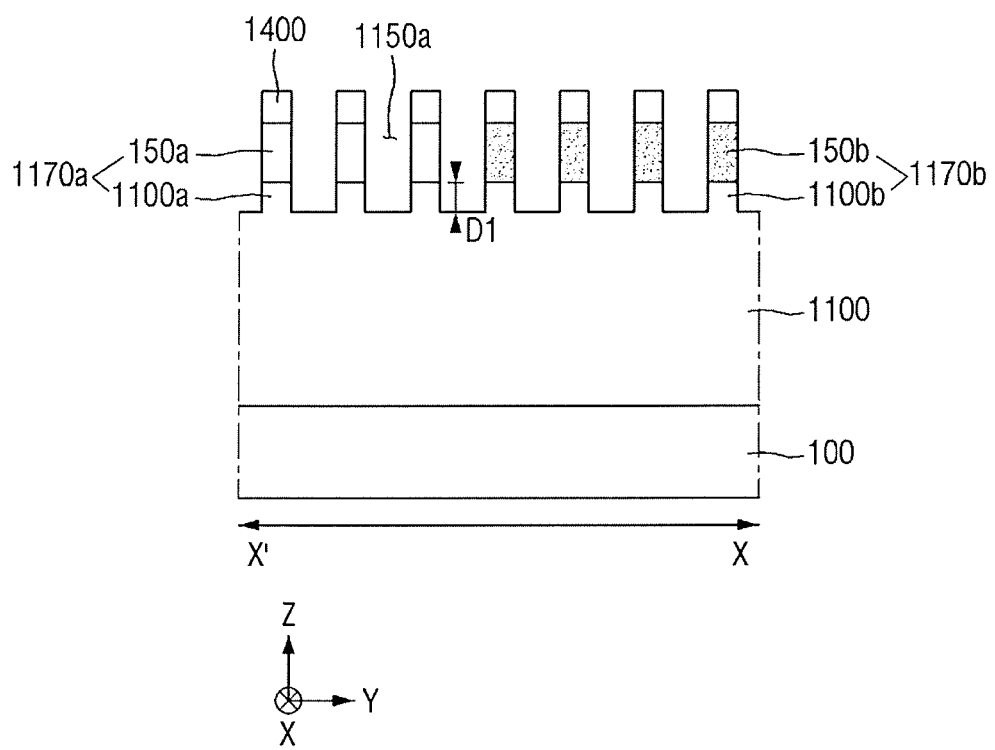

FIG. 7 shows a resulting structure formed after completing step 200 of FIG. 5. In step 200, a first etching process is performed on the heterogeneous layer 1150 and the preliminary SRB layer to form trenches 1500 and preliminary fin type structures 1170a and 1170b. A first preliminary fin type structure 1170a includes a first active fin 150a and a first preliminary protrusion 1100a. A second preliminary fin type structure 1170b includes a second active fin 150b and a second preliminary protrusion 1100b.

In an exemplary embodiment, the first etching process may include an anisotropic etching process including a reactive ion etching (RIE) process, for example. In the first etching process, hard mask patterns 1400 are used as an etch mask.

In an exemplary embodiment, a hard mask layer (not shown here) may be formed on the resulting structure of FIG. 6. For example, the hard mask layer may be formed on the heterogeneous channel layer 1150. The hard mask layer may be patterned to form the hard mask patterns 1400. The hard mask layer may be formed of a material resistant in the first etching process. For example, the material of the hard mask layer may include amorphous silicon (a-Si), titanium (Ti), titanium nitride (TiN), tantalum nitride (TaN), silicon oxide ($SiO_2$), or silicon oxynitride (SiON).

In an exemplary embodiment, a plurality of trenches 1500 is formed in the first etching process to define the first and the second preliminary fin type structures 170a and 170b. The trenches 1500 penetrate through the heterogeneous channel layer 1150 and extend into the preliminary SRB layer 1100 to a first depth D1.

For example, the heterogeneous channel layer 1150 is patterned into a plurality of first active fins 150a and a plurality of second active fins 150b, and the preliminary SRB layer 1100 is partially etched to form a plurality of the first preliminary protrusions 1100a and the second preliminary protrusions 1100b.

The first active fin 150a and the first preliminary protrusion 1100a are stacked to form the first preliminary fin type structure 1170a. The second active fin 150b and the second preliminary protrusion 1100b are stacked to form the second preliminary fin type structure 1170b. The first and the second preliminary fin type structures 1170a and 1170b are simultaneously formed in the first etching process.

For the convenience of description, each trench 1500 has sidewalls and bottom surfaces defined by straight lines. The etching profile of each trench 1500 may include a sloped or curved sidewall or may include a curved bottom surface.

Figure 8:
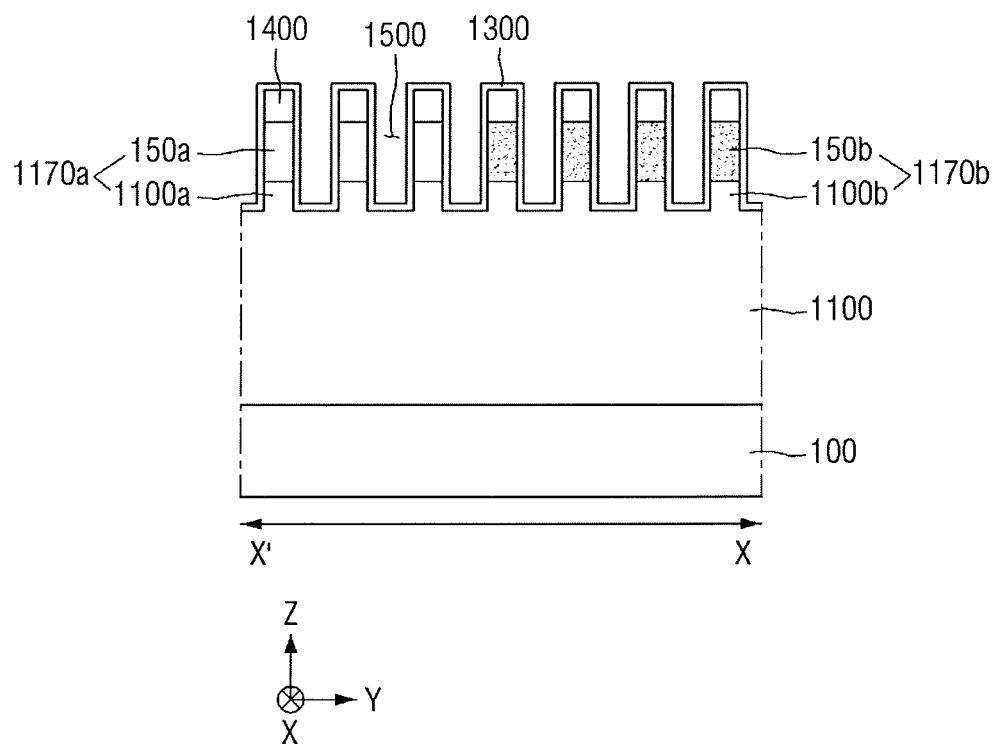

FIG. 8 shows a resulting structure formed after completing step 300 of FIG. 5. In step 300, a first liner layer 1300 is formed on the resulting structure of FIG. 7. The first liner layer 1300 is conformally formed within the trenches 1500 and without completely filling the trenches 1500. The thickness of the first liner layer 1300 is not sufficient to fill the trenches 1500. For example, the first liner layer 1300 is formed conformally on an exposed upper surface of the preliminary SRB layer 1100 between two adjacent first active fins 150a and between two adjacent second active fins 150b. The first liner layer 1300 is also formed on sidewalls of the active fins 150a and 150b. The first liner layer 1300 may be formed of silicon nitride (SiN), for example. The first liner layer 1300 may be deposited using a chemical vapor deposition (CVD) process including an atomic layer CVD process, a thermal CVD process or a plasma-enhanced CVD process.

Figure 9:
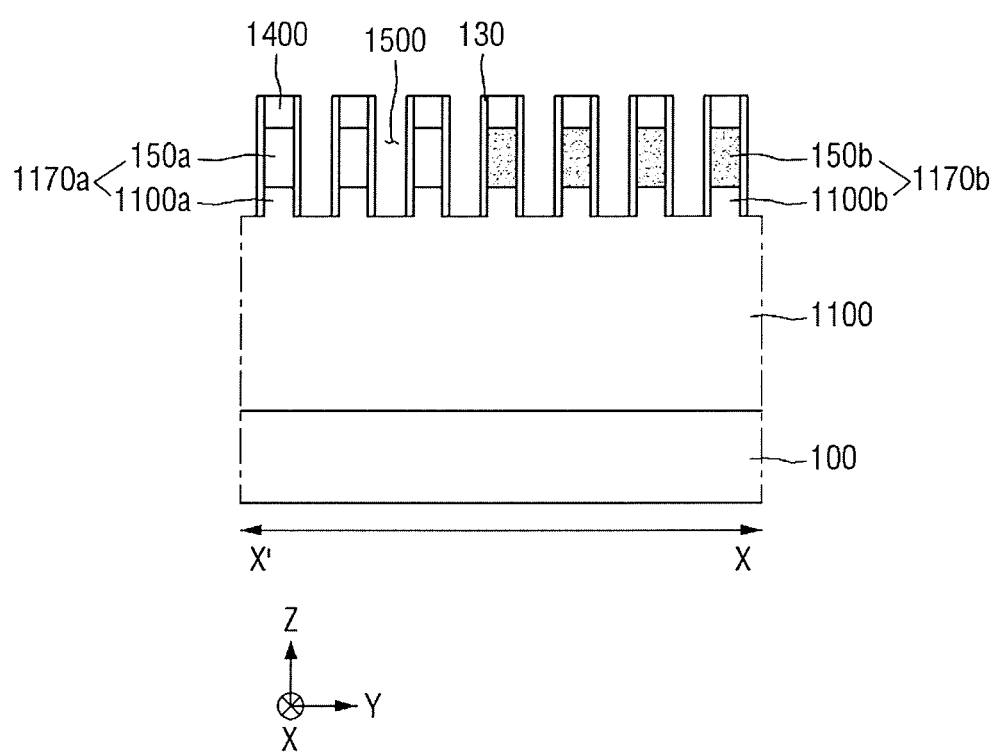

FIG. 9 shows a resulting structure formed after completing step 400 of FIG. 5. In step 4, a second etching process is applied to the resulting structure of FIG. 5 to form first liners 130 by partially etching the first liner layer 1300 of FIG. 8.

In an exemplary embodiment, the second etching process may be an anisotropic etching process including a reactive ion etching (RIE) process. The second etching process may be directional such that bottom portions and upper portions of the liner layer 1300 are completely removed and sidewall portions of the liner layer 1300 remain on the sidewalls of the preliminary fin type structures 1170a and 1170b. The bottom portions of the first liner layer 1300 are positioned within the trenches 1500. The upper portions of the first liner layer 1300 are positioned on upper surfaces of the hard mask patterns 1400. The sidewall portions of the liner layer 1300 are disposed between the bottom portions and the upper portions of the liner layer 1300.

For example, the bottom portions of the first line layer 1300 are removed to expose the upper surfaces of the preliminary SRB layer 1100 between two adjacent first preliminary fin type structures 1170a or between two adjacent second preliminary fin type structures 1170b. The upper portions of the first line layer 1300 are removed to expose the upper surfaces of the hard mask patterns 1400. Accordingly, the first liner layer 1300 of FIG. 8 is separated into a plurality of first liners 130 covering the sidewalls of the preliminary fin type structures 1170a and 1170b.

In the second etching process, an etching process of a vertical direction may be faster than an etching process of a lateral direction such that after performing of the anisotropic etching process, the first liner layer 1300 leaves the first liners 130 separated from each other. The first liners 130 remain on the sidewalls of the first preliminary fin type structures 1170a or on the sidewalls of the second preliminary fin type structures 1170b.

Figure 10:
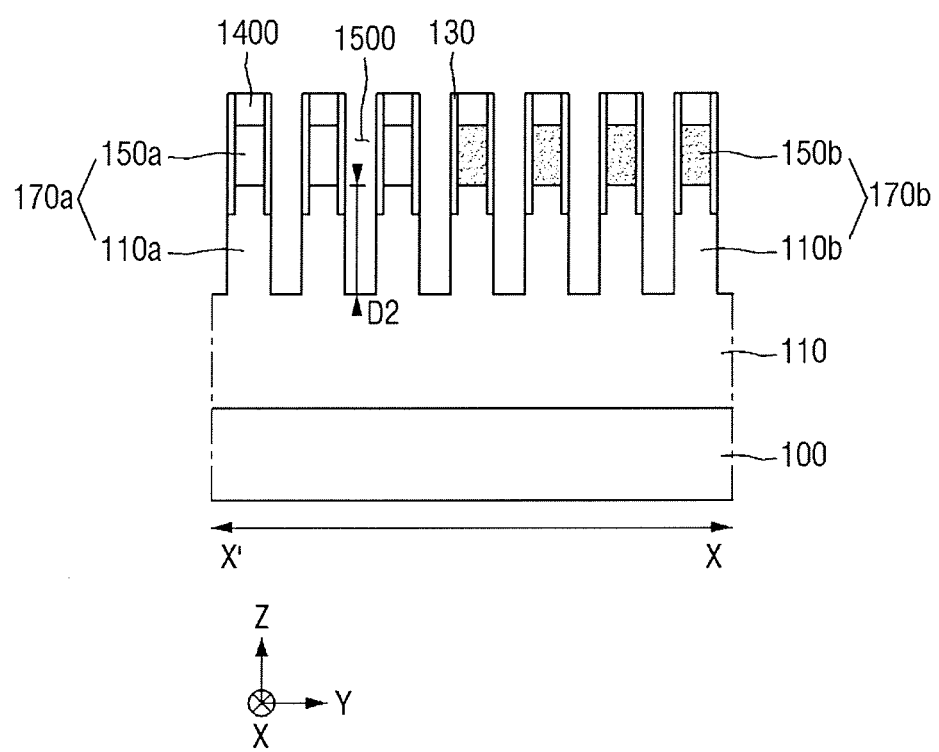

FIG. 10 shows a resulting structure formed after completing step 500 of FIG. 5. In step 500, a third etching process is performed until the trenches 300 are extended to a target depth D2 so that target fin type structures 170a and 170b are formed. The first preliminary protrusion 1100a of FIG. 9 is extended to form the first protrusion 110a of FIG. 3 as the trenches 1500 is extended to have the second depth D2.

In an exemplary embodiment, the third etching process may be an anisotropic etching process including a reactive ion etching (RIE) process. The third etching process may be directional such that the preliminary SRB layer 1100 exposed by the first liners 130 are removed so that the first depth D1 is extended to the second depth D2.

The third etching process may be performed on the preliminary SRB layer 1100 using an etchant gas having etch selectivity with respect to the first liners 130.

In the third etching process, the preliminary SRB layer 1100 is partially removed using the hard mask patterns 1400 and the first liners 130 as an etch mask, and the active fins 150a and 150b covered by the mask patterns 1400 and the first liners 130 are protected from the third etching process. Accordingly, the active fins 150a and 150b maintain the etching profiles of FIG. 9 formed after the first etching process performed in step 200. The first liners 130 may serve to prevent the sidewalls of the active fins 150a and 150b from being laterally etched.

For the convenience of description, an etching profile of each trench 1500 after completing step 500 has straight lines. The etching profile of each trench 1500 may include a sloped or curved sidewall or may include a curved bottom surface.

For the convenience of description, the hard mask patterns 1400 are assumed to maintain the same profile in the performing of the first etching process, the second etching process and the third etching process. In an exemplary embodiment, the hard mask patterns 1400 may be resistant to the etching processes, but may change profiles in the first to the third etching process.

Figure 11:
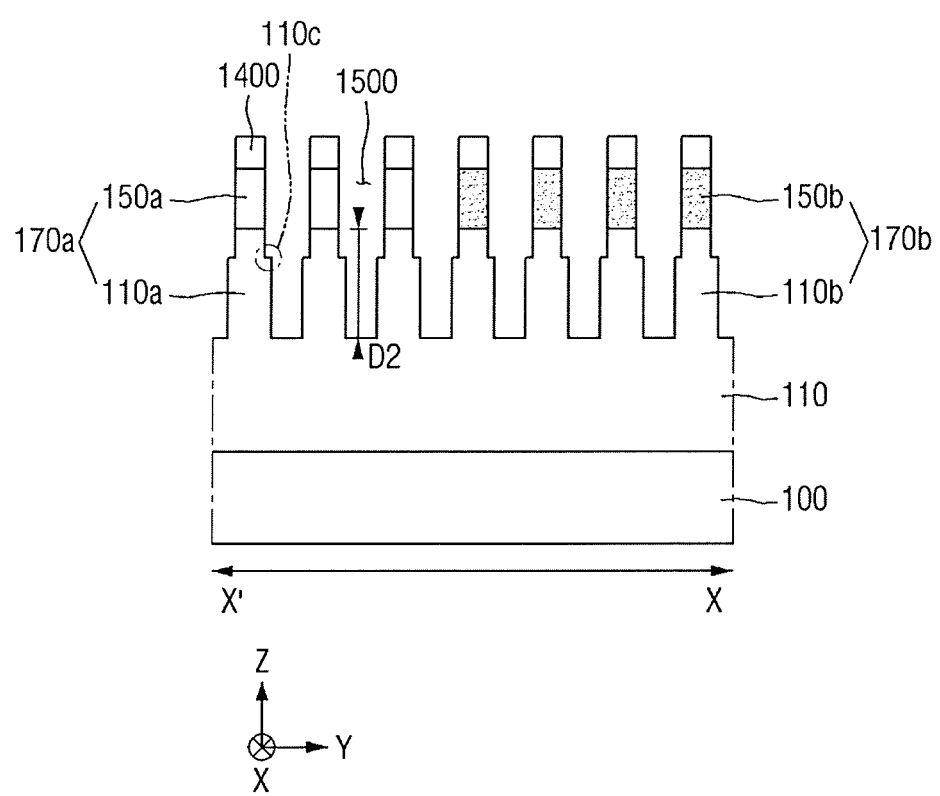

FIG. 11 shows a resulting structure formed after completing step 600 of FIG. 5. In step 600, the first liners 130 are removed so that the fin type structures 170a and 170b are exposed. In an exemplary embodiment, an isotropic etching process may be performed on the first liners 130 using etchants having etch selectivity with respect to the SRB layer 110. For example, the first liners 130 may be formed of silicon nitride, and the SRB layer 110 may be formed of a first silicon germanium alloy.

In an exemplary embodiment, the preliminary SRB layer 1100 are subject to two etching processes including the first etching process and the second etching process. In the second etching process, the preliminary SRB layer 1100 is etched using the first liners 130 as an etch mask, and thus the etching profile of the SRB layer 110 has shoulders 110c.

In an exemplary embodiment, the active fins 110a and 110b are formed using a single etching process (the first etching process), and the preliminary SRB layer 1100 having the first protrusion 110a and the second protrusion 110b are formed using two etching processes (the first etching process and the second etching process). In the second etching process, the preliminary SRB layer 1100 is etched using the first liners 130 so that the SRB layer 110 includes the shoulders 110c.

Figure 12:
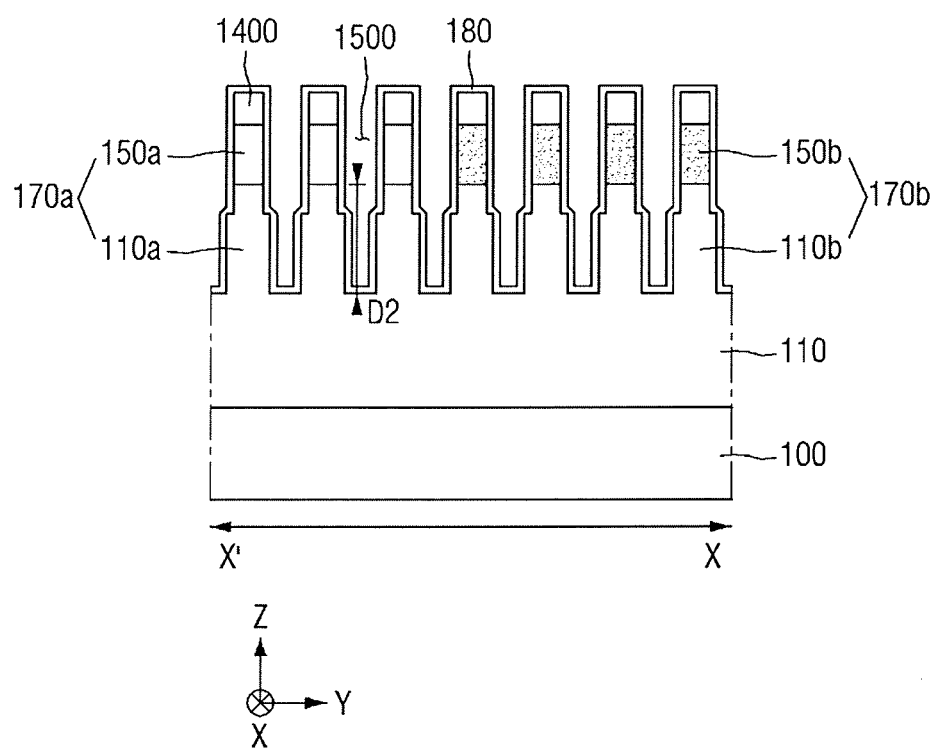

FIG. 12 shows a resulting structure formed after completing step 700 of FIG. 5. A second liner layer 180 is conformally formed on the resulting structure of FIG. 11. The second liner layer 1800 may have a thickness not sufficient to fill the trenches 1500.

Figure 13:
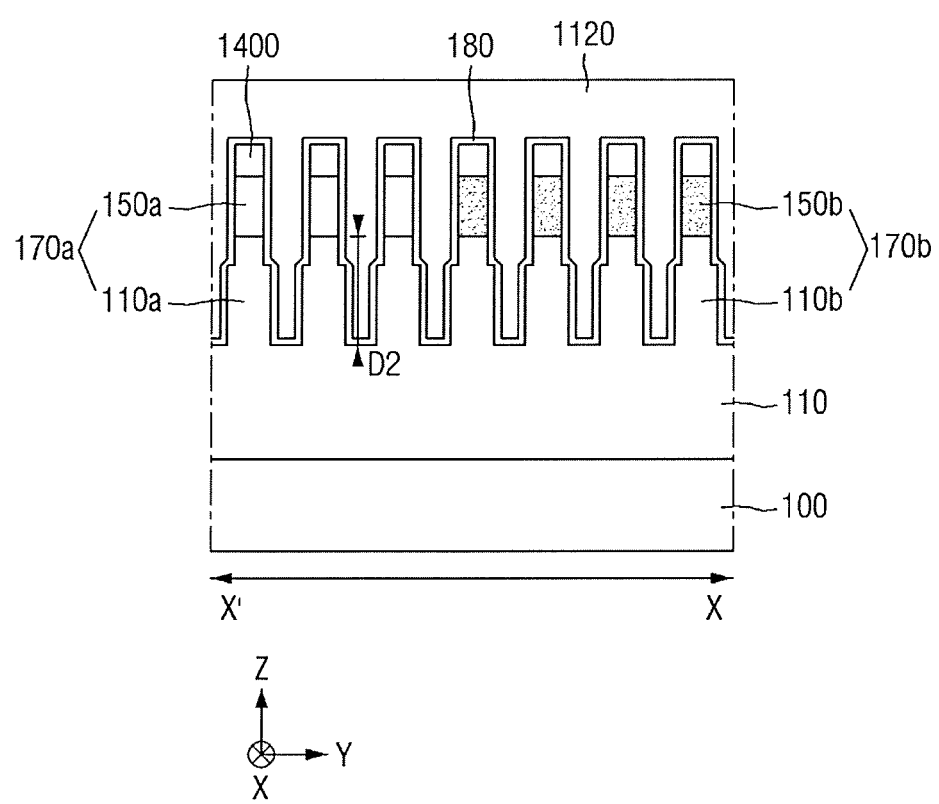

FIG. 13 shows a resulting structure formed after completing step 800 of FIG. 5. In an exemplary embodiment, a trench gap filling process is performed so that an insulation layer 1120 completely fills the trenches 1500. In the trench gap filling process, a flowable dielectric material layer may be formed in the trenches 1500 using a chemical vapor deposition (CVD) process, and then the deposited flowable dielectric material layer may be heated at a predetermined temperature so that the flowable dielectric material layer flows to fill the trenches 1500. The active fins 150a and 150b may be oxidized if the second liner layer 180 does not cover the active fins 150a and 150b. In an exemplary embodiment, the second liner layer 180 is formed of silicon nitride which may serve as an oxygen diffusion barrier.

Figure 14:
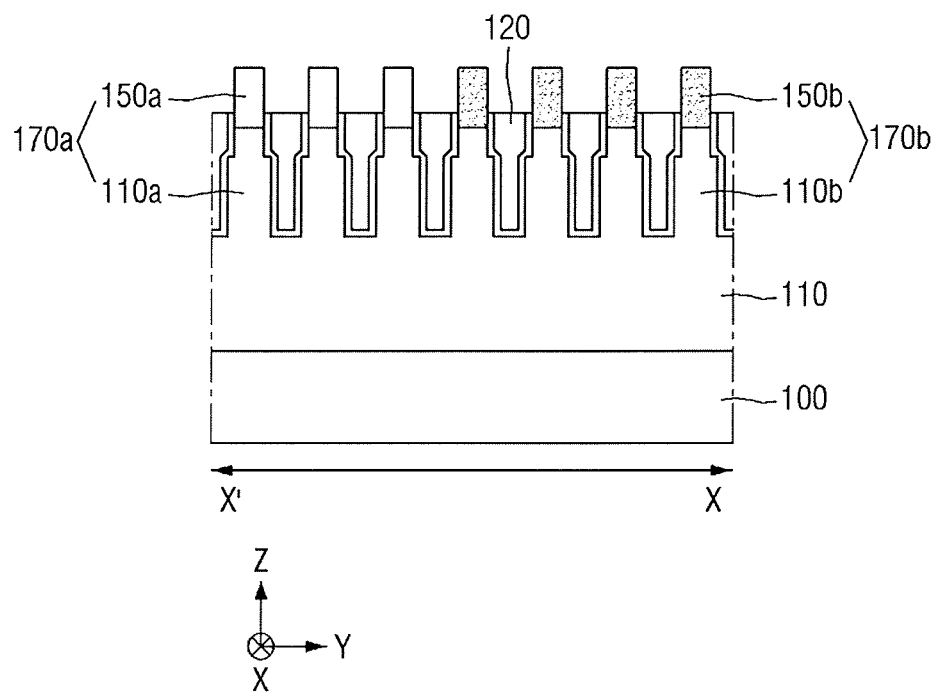

FIG. 14 shows a resulting structure formed after completing step 900 of FIG. 5. The insulation layer 1120 is recessed to form the isolation 120. In an exemplary embodiment, the insulation layer 1120 may be recessed using an etch-back process. In an exemplary embodiment, the insulation layer 1120 may be first recessed using a chemical-mechanical-polishing process and then recessed using an etch-back process. An upper surface of the isolation 120 is higher than a boundary between first active fin 150a and the first protrusion 110a or higher than a boundary between the second active fin 150b and the second protrusion 110b.

Figure 15:
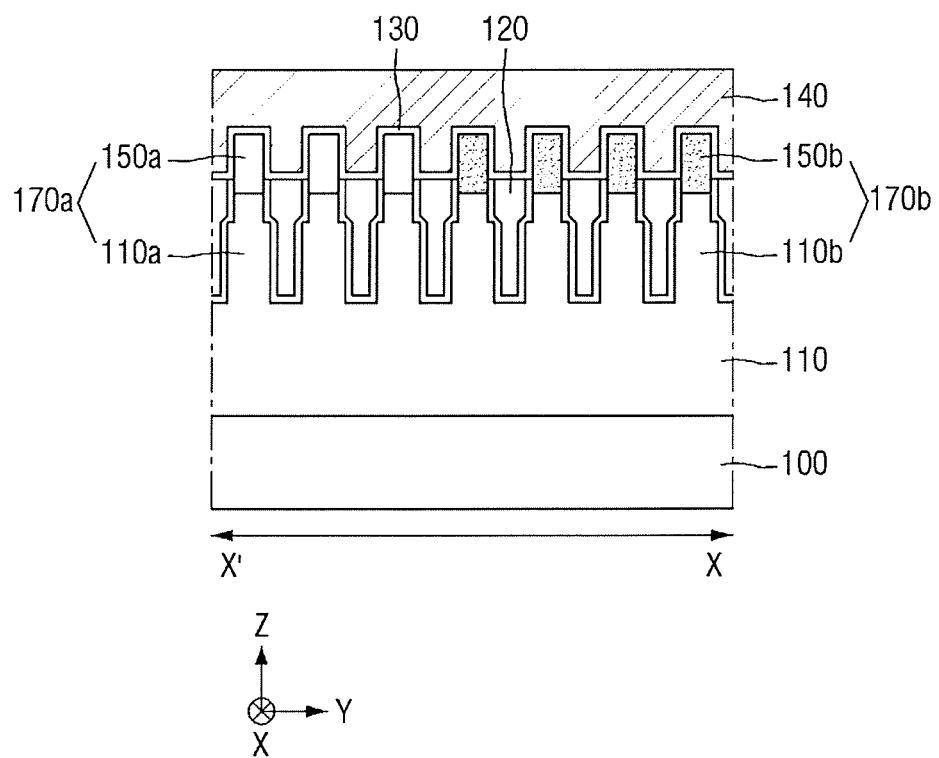

FIG. 15 shows a resulting structure formed after completing step 1000 of FIG. 5. In step 1000, a gate oxide layer 130 is formed and then a gate electrode 140 is formed on the gate oxide layer 130. A gate electrode layer (not shown here) may be formed on the gate oxide layer 130, and then may be patterned to form a plurality of gate electrodes 140. The gate electrodes 140 are extended in parallel to the second direction of y-axis. The gate electrodes 140 are spaced apart from each other in parallel to the first direction of x-axis.

Figure 16:
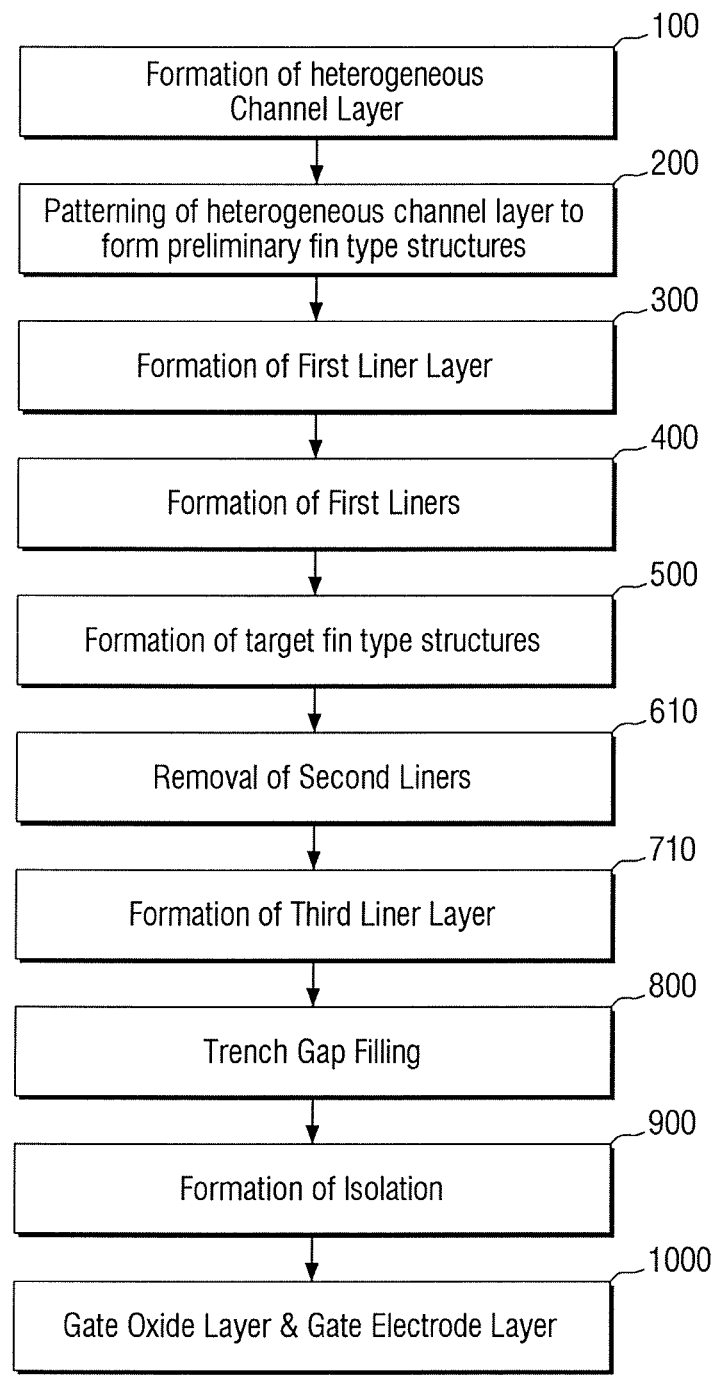
FIG. 16 shows a flowchart of simultaneously fabricating fin type structures of FIG. 3 according to an exemplary embodiment of the present inventive concept.
Figure 17:
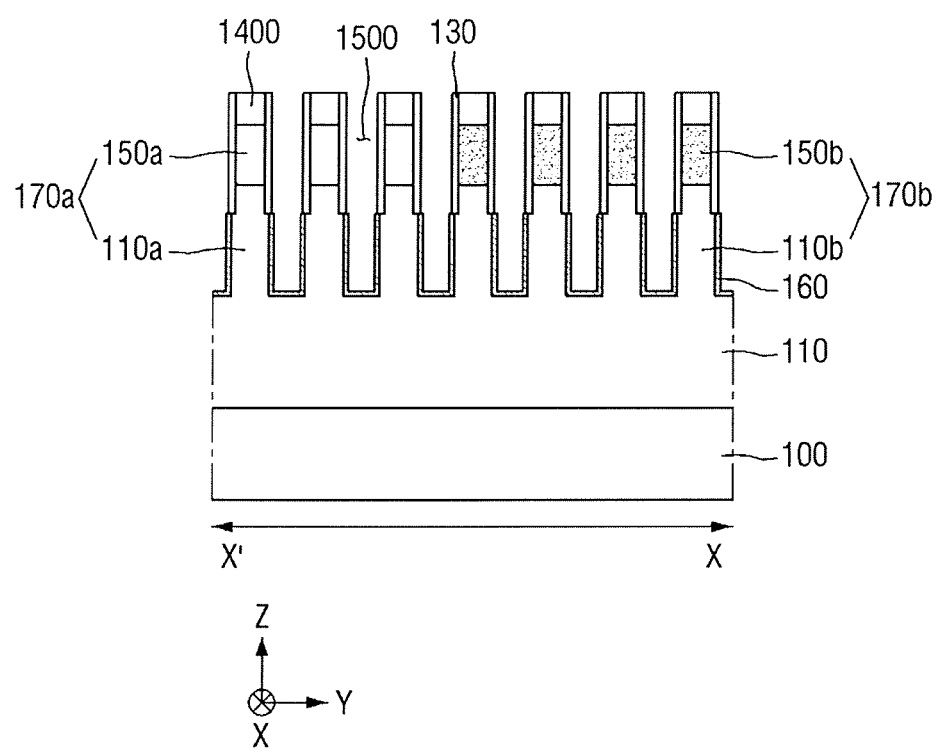
FIGS. 17 to 19 show vertical cross-sectional views of fin type structures simultaneously fabricated according to the flowchart of FIG. 16.
Figure 18:
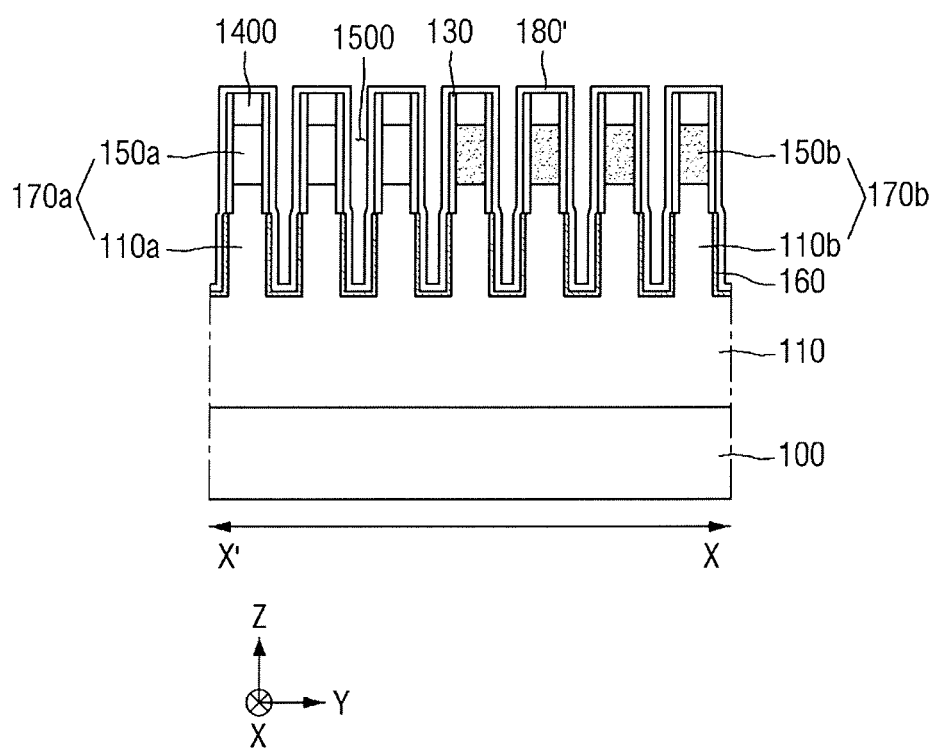
Figure 19:
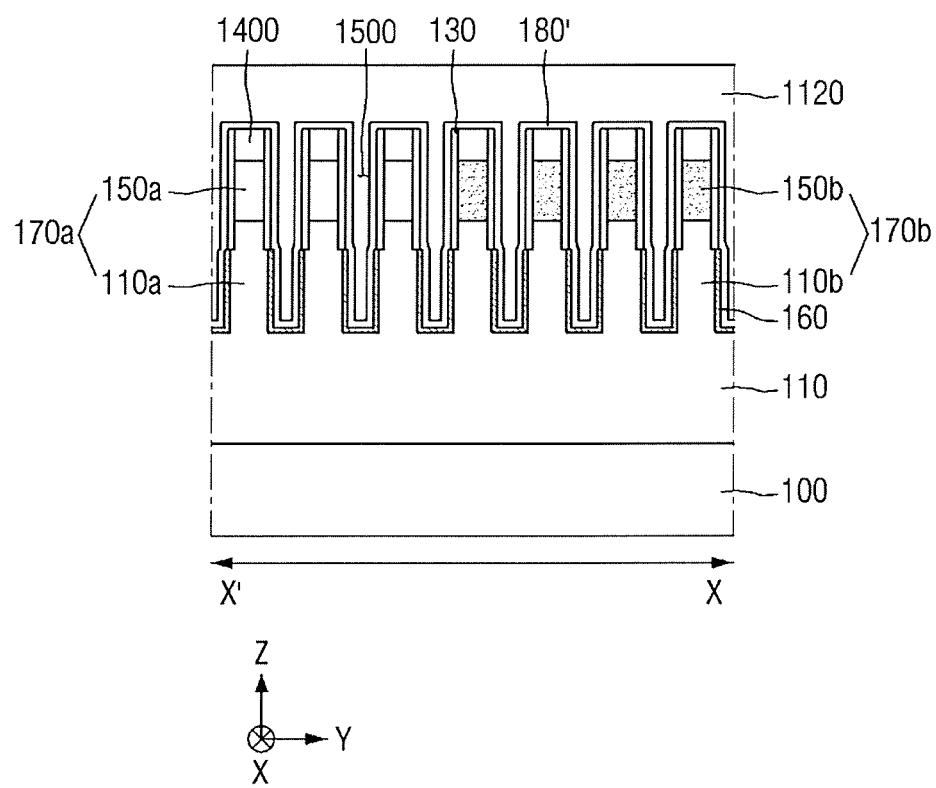

Hereinafter, a fabrication process of the fin type structures 170a and 170b of FIG. 3 will be described with reference to FIGS. 16 to 19. FIG. 16 shows a flowchart of simultaneously fabricating the fin type structures 170a and 170b of FIG. 3 according to an exemplary embodiment of the present inventive concept. FIGS. 17 to 19 show vertical cross-sectional views of the fin type structures 170a and 170b simultaneously fabricated according to the flowchart of FIG. 16. The flowchart of FIG. 16 may be substantially the same with the flowchart of FIG. 5 except for steps 610 and 710. The cross-sectional structures of the same steps of FIG. 16 with the steps of FIG. 5 are omitted, and the descriptions will be made on steps different from FIG. 5.

FIG. 17 shows a resulting structure formed after completing step 610 of FIG. 16. The steps 100 to 500 of FIG. 16 are substantially the same with the steps 100 to 600 of FIG. 5. For example, the step 610 of FIG. 16 is performed on the resulting structure of FIG. 10. The repeated steps/structures will be omitted.

In step 600, second liners 160 are formed by oxidizing the exposed surface of the SRB layer 110 using an oxidation process. The oxidation process may include a thermal oxidation process or an in-situ steam generation (ISSG) oxidation process. In an exemplary embodiment, the oxidation liners 160 may be formed using an ISSG oxidation process, which may be performed in a rapid thermal process (RTP) apparatus. In an exemplary embodiment, the ISSG oxidation of the exposed surface of the SRB layer 110 is carried out in a mixture of oxygen-containing gas and hydrogen-containing gas. The temperature of the RTP may be in the range from about 800° C. to about 1150° C. In the oxidation process, the exposed surface of the SRB layer 110 may partly consumed so that the consumed part of the SRB layer 110 may correspond to the second liners 160.

FIG. 18 shows a resulting structure formed after completing step 710. A third liner layer 180' is formed on the resulting structure of FIG. 17. The third liner layer 180' is formed within the trenches 1500 and without completely filling the trenches 1500. The third liner layer 180' may be formed of silicon nitride. In an exemplary embodiment, the third liner layer 180' may be formed using substantially the same process as the second liner layer 180 of FIG. 12. The active fins 150a and 150b are covered by a dual liner having the first liners 130 and the third liner layer 180'. In an exemplary embodiment, the first liners 130 and the third liner layer 180' may be formed of silicon nitride, for example. The dual liner may serve to protect the active fins 150a and 150b in the subsequent process of forming an insulation layer 1120.

FIG. 19 shows a resulting structure formed after completing step 800. In step 800, the insulation layer 1120 is formed on the resulting structure of FIG. 18 to completely fills the trenches 1500 using a deposition process including a spin-on dielectric process. The steps 800 to 1000 of FIG. 5 may be applied to the resulting structure of FIG. 18, and thus repeated descriptions are omitted for the convenience of descriptions.

Figure 20:
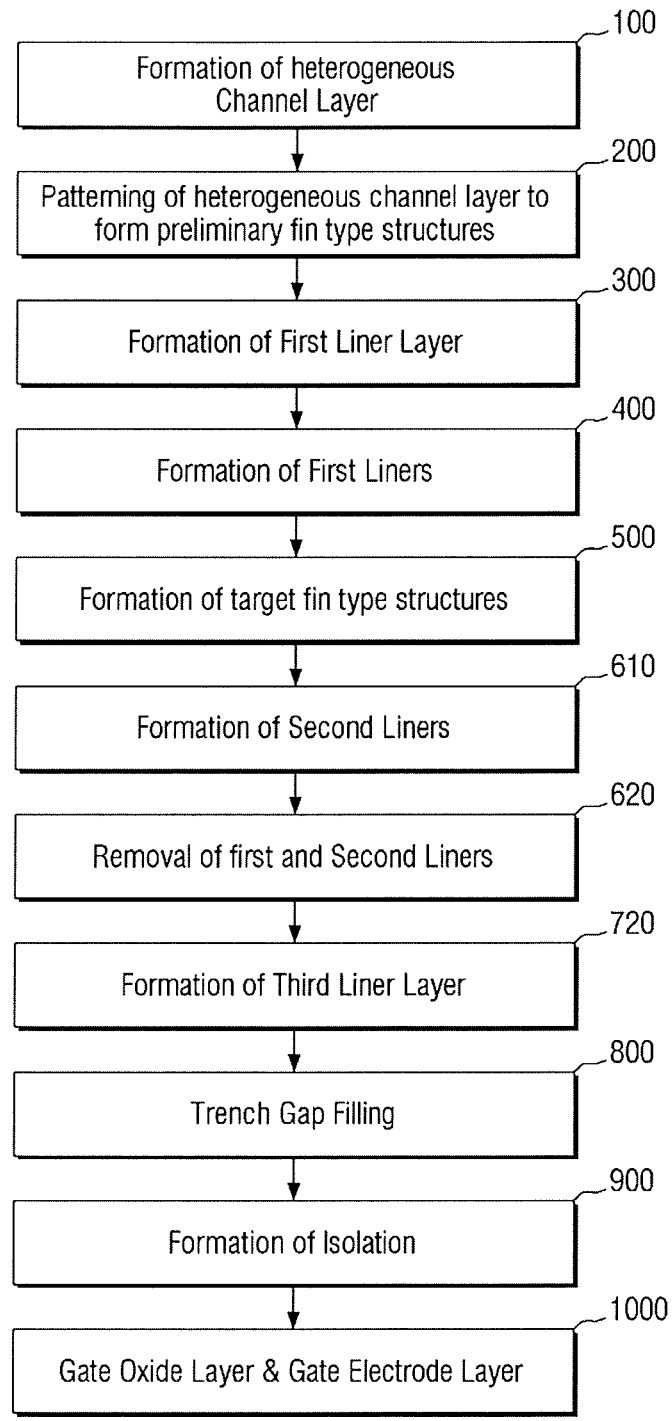
FIG. 20 shows a flowchart of simultaneously fabricating fin type structures of FIG. 3 according to an exemplary embodiment of the present inventive concept.
Figure 21:
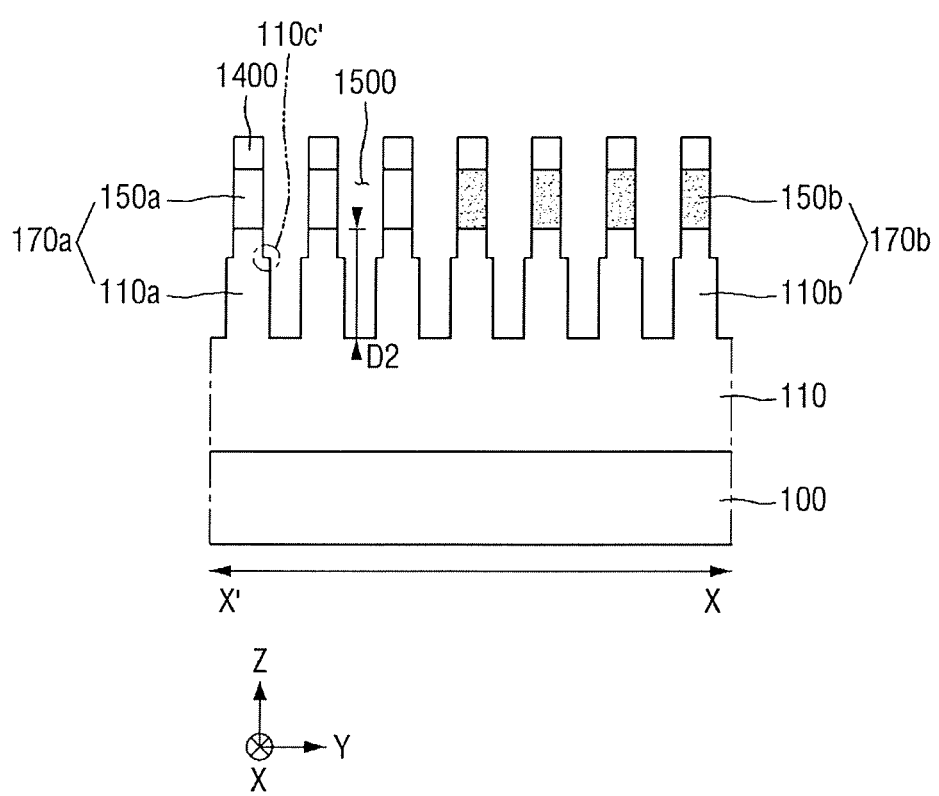
FIGS. 21 and 22 show vertical cross-sectional views of fin type structures simultaneously fabricated according to the flowchart of FIG. 20.
Figure 22:
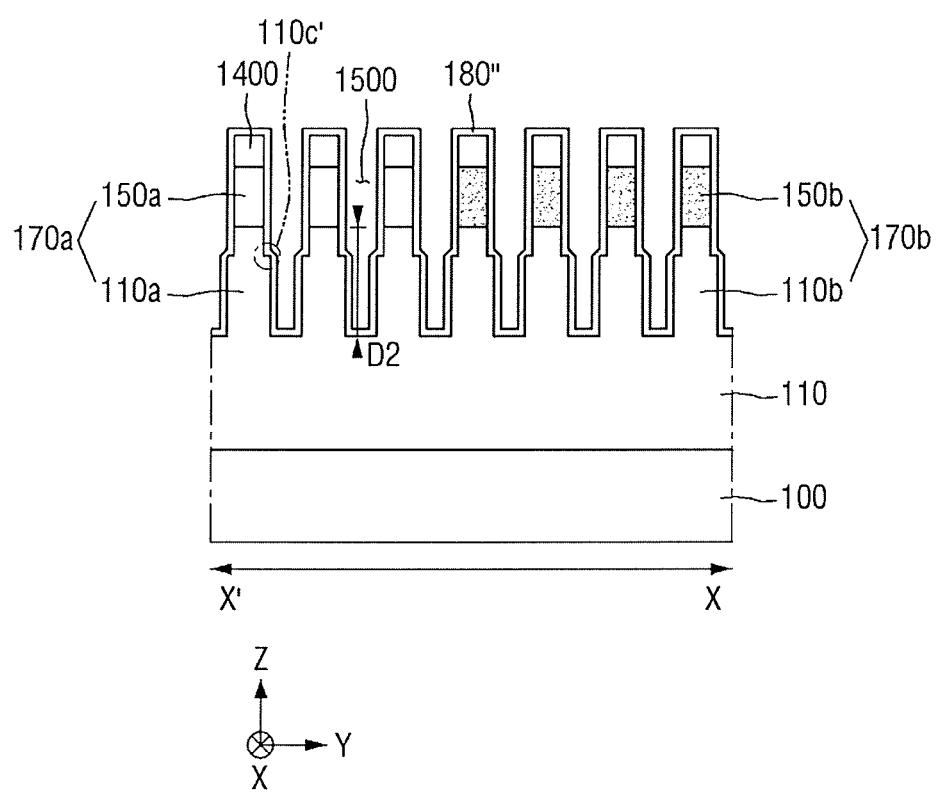

Hereinafter, a fabrication process of the fin type structures 170a and 170b of FIG. 3 will be described with reference to FIGS. 20 to 22. FIG. 20 shows a flowchart of simultaneously fabricating the fin type structures 170a and 170b of FIG. 3 according to an exemplary embodiment of the present inventive concept. FIGS. 21 and 22 show vertical cross-sectional views of the fin type structures 170a and 170b simultaneously fabricated according to the flowchart of FIG. 20. The flowchart of FIG. 20 may be substantially the same with the flowchart of FIG. 16 except for steps 620 and 720. The cross-sectional structures of the same steps of FIG. 20 with the steps of FIG. 16 are omitted, and the descriptions will be made on steps different from FIG. 5. The steps 100 to 500 are performed as described with reference to FIGS. 5 and 6 to 10. The step 610 is performed as described with reference to FIGS. 16 and 17.

FIG. 21 shows a resulting structure formed after completing step 620 of FIG. 20. In step 620, the first liners 130 and the second liners 160 are removed so that the fin type structures 170a and 170b are exposed.

In an exemplary embodiment, an isotropic etching process may be performed on the first liners 130 and the second liners 160 using etchants having etch selectivity with respect to the SRB layer 110. For example, the first liners 130 may be formed of silicon nitride, and the SRB layer 110 may be formed of a first silicon germanium alloy; the second liner 160 may be formed of silicon oxide.

In an exemplary embodiment, the preliminary SRB layer 1100 are subject to two etching processes including the first etching process and the second etching process. In the second etching process, the preliminary SRB layer 1100 is etched using the first liners 130 as an etch mask, and thus the etching profile of the SRB layer 110 has shoulders 110c'. The shoulders 110c' of FIG. 21 are narrower than the shoulders 110c of FIG. 11, due to the removal of the second liners 160. The second liners 160 may be formed at consumption of the 110, and thus the removal of the second liners 160 may broaden the bottom portions of the trenches 1500.

FIG. 22 shows a resulting structure formed after completing step 720. A third liner layer 180" is formed on the resulting structure of FIG. 21. The third liner layer 180" is formed within the trenches 1500 and without completely filling the trenches 1500. The third liner layer 180" may be formed of silicon nitride. In an exemplary embodiment, the third liner layer 180" may be formed using substantially the same process as the second liner layer 180 of FIG. 12. Since the bottom portions of the trenches 1500 are broadened compared with FIG. 11, the aspect ratio of the trenches 1800 is reduced to facilitate the formation of the third liner layer 180" compared with the formation of the third liner layer 180' of FIG. 18.

Figure 23:
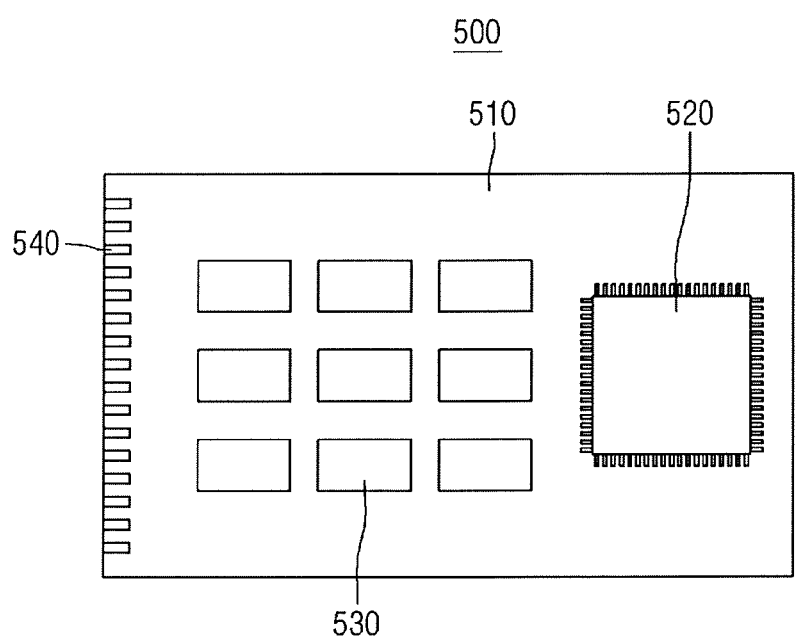
FIG. 23 is a semiconductor module having a semiconductor device fabricated according to an exemplary embodiment of the present inventive concept.

FIG. 23 is a semiconductor module having a semiconductor device fabricated according to an exemplary embodiment of the present inventive concept.

Referring to FIG. 23, the semiconductor module 500 includes a semiconductor device 530 according to an exemplary embodiment. The semiconductor device 530 is mounted on a semiconductor module substrate 510. The semiconductor module 500 further includes a microprocessor 520 mounted on the semiconductor module substrate 510. Input/output terminals 540 are disposed on at least one side of the semiconductor module substrate 510. The semiconductor module 500 may be included in a memory card or a solid state drive (SSD).

Figure 24:
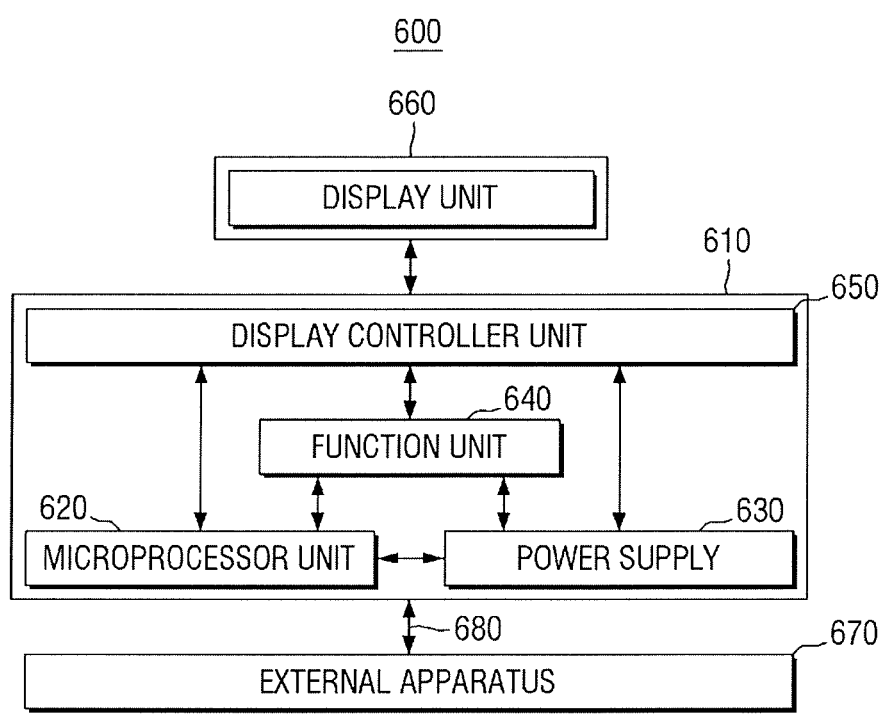
FIG. 24 is a block diagram of an electronic system having a semiconductor device according to an exemplary embodiment of the present inventive concept.

FIG. 24 is a block diagram of an electronic system having a semiconductor device according to an exemplary embodiment of the present inventive concept.

Referring to FIG. 24, a semiconductor device fabricated according to an exemplary embodiment of the present inventive concept is applied to the electronic system 600. The electronic system 600 includes a body 610, a microprocessor unit 620, a power supply 630, a function unit 640, and a display controller unit 650. The body 610 may include a system board or a motherboard having a PCB or the like. The microprocessor unit 620, the power supply 630, the function unit 640, and the display controller unit 650 are mounted or disposed on the body 610. A display unit 660 is disposed on an upper surface of the body 610 or outside the body 610. For example, the display unit 660 is disposed on a surface of the body 610, displaying an image processed by the display controller unit 650. The power supply 630 receives a constant voltage from an external power supply, generating various voltage levels to supply the voltages to the microprocessor unit 620, the function unit 640, the display controller unit 650, etc. The microprocessor unit 620 receives a voltage from the power supply 630 to control the function unit 640 and the display unit 660. The function unit 640 may perform various functions of the electronic system 600. For example, when the electronic system 600 is a mobile electronic product such as a cellular phone, or the like, the function unit 640 may include various components to perform wireless communication functions such as dialing, video output to the display unit 660 or voice output to a speaker through communication with an external device 670, and when a camera is included, it may serve as an image processor. Alternatively, if the electronic system 600 is connected to a memory card to expand the capacity, the function unit 640 may serve as a memory card controller. The function unit 640 may exchange signals with the external device 670 through a wired or wireless communication unit 680. Further, when the electronic system 600 requires a Universal Serial Bus (USB) to extend the functions, the function unit 640 may serve as an interface controller. The function unit 640 may include a semiconductor device fabricated according to an exemplary embodiment of the present inventive concept.

Figure 25:
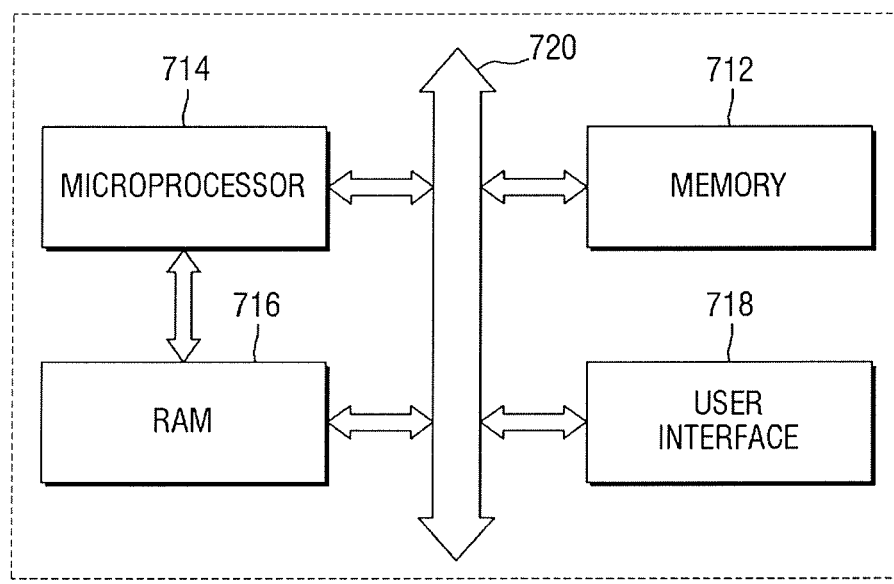
FIG. 25 is a block diagram of an electronic system having a semiconductor device fabricated according to an exemplary embodiment of the present inventive concept.

FIG. 25 is a block diagram of an electronic system having a semiconductor device fabricated according to an exemplary embodiment of the present inventive concept.

Referring to FIG. 25, the electronic system 700 may be included in a mobile device or a computer. For example, the electronic system 700 includes a memory system 712, a microprocessor 714, a RAM 716, and a user interface 718 configured to perform data communication using a bus 720. The microprocessor 714 may program and control the electronic system 700. The RAM 716 may be used as an operational memory of the microprocessor 714. For example, the microprocessor 714 or the RAM 716 may include a semiconductor device fabricated according an exemplary embodiment of the present inventive concept.

The microprocessor 714, the RAM 716, and/or other components may be assembled within a single package. The user interface 718 may be used to input or output data to or from the electronic system 700. The memory system 712 may store operational codes of the microprocessor 714, data processed by the microprocessor 714, or data received from the outside. The memory system 712 may include a controller and a memory.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A method of fabricating a semiconductor device, comprising:
   forming a heterogeneous channel layer on a strain relaxed buffer (SRB) layer, the heterogeneous channel layer including a silicon layer on a first portion of the SRB layer and a silicon germanium (SiGe) alloy layer on a second portion of the SRB layer;
   performing a first etching process on the heterogeneous channel layer and the SRB layer to form a plurality of first trenches and a plurality of second trenches, wherein each first trench penetrates through the silicon layer and into the first portion of the SRB layer to a first depth, and wherein each second trench penetrates through the SiGe alloy layer and into the second portion of the SRB layer to a second depth;
   forming first liners on first sidewalls of the first trenches having the first depth and second sidewalls of the second trenches having the second depth; and
   performing a second etching process on the SRB layer exposed by the first liners so that the first trenches are extended to a third depth to form a plurality of first fin type structures and the second trenches are extended to a fourth depth to form a plurality of second fin type structures, wherein the first fin type structures are defined by the first trenches having the third depth and the second fin type structures are defined by the second trenches having the fourth depth.

2. The method of claim 1,
   wherein the first trenches having the first depth and the second trenches having the second depth are formed at substantially the same time in the performing of the first etching process, and
   wherein the first depth and the second depth are substantially the same.

3. The method of claim 1,
   wherein the first trenches having the third depth and the second trenches having the fourth depth are formed at substantially the same time in the performing of the second etching process, and
   wherein the third depth and the fourth depth are substantially the same.

4. The method of claim 1, further comprising:
   forming second liners on third sidewalls of the first trenches having the third depth and fourth sidewalls of the second trenches having the fourth depth,
   wherein the third sidewalls and the fourth sidewalls are exposed by the first liners,
   wherein upper portions of the first fin type structures and upper portions of the second fin type structures are covered by the first liners,
   wherein lower portions of the first fin type structures and lower portions of the second fin type structures are covered by the second liners, and
   wherein each of the first liners is in contact with each of the second liners.

5. The method of claim 4, further comprising:
   forming third liners on sidewalls of the first fin type structures and sidewalls of the second fin type structures,
   wherein the first liners and the second liners are covered by the third liners.

6. The method of claim 5, further comprising:
   forming an insulating oxide layer on the third liner,
   wherein the insulating oxide layer completely fills the first trenches having the third depth and the second trenches having the fourth depth.

7. The method of claim 6, further comprising:
   planarizing the insulating oxide layer until upper surfaces of the first fin type structures and upper surfaces of the second fin type structures are exposed.

8. The method of claim 1,
   wherein the SRB layer is formed of a first silicon germanium alloy having a first germanium atomic percent,
   wherein the SiGe alloy layer is formed of a second silicon germanium alloy having a second germanium atomic percent greater than the first germanium atomic percent, and
   wherein the silicon layer does not include germanium atoms.

9. The method of claim 1, further comprising:
   removing completely the first liners;

forming fourth liners on sidewalls of the first fin type structures and sidewalls of the second fin type structures; and forming an insulating oxide layer on the fourth liners, wherein the insulating oxide layer completely fills the first trenches having the third depth and the second trenches having the fourth depth.

10. The method of claim 1,
wherein an upper surface of the silicon layer and an upper surface of the SiGe alloy layer are substantially coplanar.

11. The method of claim 5,
wherein the first liners are formed of silicon nitride,
wherein the second liners are formed of silicon oxide, and
wherein the third liners are formed of silicon nitride.

12. The method of claim 9,
wherein the first liners are formed of silicon nitride, and
wherein the fourth liner is formed of silicon nitride.

13. A method of fabricating a semiconductor device, comprising:
forming a channel layer on a strain relaxed buffer (SRB) layer;
performing a first etching process on the channel layer and the SRB layer to form a plurality of trenches, wherein the trenches penetrate through the channel layer and into the SRB layer to a first depth;
forming first liners on first sidewalls of the trenches having the first depth, wherein the first liners cover the first sidewalls; and
performing a second etching process on the SRB layer exposed through the trenches, wherein the second etching process is performed on the SRB layer using a gas etchant having etch selectivity with respect to the first liners so that after the performing of the second etching process, the first liners remain on the first sidewalls.

14. The method of claim 13,
wherein the trenches of which the first sidewalls are covered by the first liners are extended to a second depth to form a plurality of fin type structures in the second etching process, and
wherein the fin type structures are defined by the trenches having the second depth.

15. The method of claim 14, further comprising:
removing completely the first liners;
forming second liners on sidewalls of the plurality of fin type structures; and
forming an insulating oxide layer on the second liners, wherein the insulating oxide layer completely fills the trenches having the second depth.

16. The method of claim 15,
wherein the first liners and the second liners are formed of silicon nitride.

17. The method of claim 13,
wherein the SRB layer is formed of $Si_xGe_y$.

18. The method of claim 13,
wherein the SRB layer is formed of a first silicon germanium alloy having a first germanium atomic percent, and
wherein the channel layer is formed of silicon or a second silicon germanium alloy having a second germanium atomic percent greater than the first germanium atomic percent.

19. A semiconductor device, comprising:
a first transistor and a second transistor disposed on a strain relaxed buffer (SRB) layer, wherein the SRB layer includes a first protrusion and a second protrusion and wherein the first protrusion and the second protrusion are protruded from an upper surface of the SRB layer; and
a gate line connected to a first gate electrode of the first transistor and a second gate electrode of the second transistor,
wherein the first transistor includes a silicon layer stacked on an upper surface of the first protrusion,
wherein the second transistor includes a silicon germanium alloy layer stacked on the second protrusion,
wherein a width of the first protrusion is greater than a width of the silicon layer, the width of the first protrusion and the width of the silicon layer being measured at a boundary between the first protrusion and the silicon layer, and
wherein a width of the second protrusion is greater than a width of the silicon germanium alloy layer, the width of the second protrusion and the width of the silicon germanium alloy layer being measured at a boundary between the second protrusion and the silicon germanium alloy layer.

20. The semiconductor device of claim 19,
wherein the SRB layer is formed of a first silicon germanium alloy having a first germanium atomic percent, and
wherein the silicon germanium alloy layer is formed of a second silicon germanium alloy having a second germanium atomic percent greater than the first germanium atomic percent.

* * * * *